(12) United States Patent
Song (10) Patent No.: US 9,396,816 B2
(45) Date of Patent: Jul. 19, 2016

(54) SEMICONDUCTOR DEVICE AND SEMICONDUCTOR SYSTEM INCLUDING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/489,020

(22) Filed: Sep. 17, 2014

(65) Prior Publication Data

US 2015/0348650 A1 Dec. 3, 2015

(30) Foreign Application Priority Data

May 27, 2014 (KR) .................. 10-2014-0063663

(51) Int. Cl.
*G11C 29/44* (2006.01)
*G11C 7/20* (2006.01)
*G11C 7/22* (2006.01)
*G11C 29/46* (2006.01)
*G11C 29/04* (2006.01)

(52) U.S. Cl.
CPC ................ *G11C 29/44* (2013.01); *G11C 29/46* (2013.01); *G11C 2029/0409* (2013.01)

(58) Field of Classification Search
None
See application file for complete search history.

(56) References Cited

U.S. PATENT DOCUMENTS

2015/0124542 A1* 5/2015 Hwang ............... G11C 29/027
365/200

FOREIGN PATENT DOCUMENTS

KR 1020010086851 9/2001

* cited by examiner

*Primary Examiner* — James G Norman
(74) *Attorney, Agent, or Firm* — IP & T Group LLP (57) ABSTRACT

A semiconductor system includes: a memory controller; and a memory which determines whether to enable a control signal in response to block mode entry signals applied from the memory controller, enters a repair mode in response to a first address and a first command applied from the memory controller, and blocks an entry to the repair mode during an enabling section of the control signal.

20 Claims, 5 Drawing Sheets

SEMICONDUCTOR DEVICE AND SEMICONDUCTOR SYSTEM INCLUDING THE SAME

CROSS-REFERENCE TO RELATED APPLICATIONS

The present application claims priority of Korean Patent Application No. 10-2014-0063663, filed on May 27, 2014, which is incorporated herein by reference in its entirety.

BACKGROUND

1. Field

Exemplary embodiments of the present invention relate to a semiconductor design technology, and more particularly, to a post-package repair of a semiconductor system.

2. Description of the Related Art

When only one of the millions or billions of minute memory cells in a semiconductor device is defective, the semiconductor device may not operate properly. Without a way to repair these devices, they would have to be discarded as defective products. However, abandoning the whole semiconductor device due to few defective memory cells is inefficient and hurts production yield. Nowadays, product yield has been improved by preparing spare memory cells and replacing defective memory cells with the spare memory cells to revive the memory. The spare memory cells are referred to as redundancy memory cells.

In general, a repair process using redundancy memory cells is carried out in such a way to preset a spare row or column of redundancy memory cells in every cell array and replace a row or column of memory cells including defective memory cells with the preset spare row or column. In other words, when a defective memory cell is found through a test operation after the completion of a wafer process of a semiconductor device, an internal circuit performs a program operation of the address of a defective line corresponding to the defective memory cell. Therefore, when the address of the defective line is inputted under actual conditions, the defective line is replaced with a spare line.

The method for repairing a defective memory cell is divided into a method for repairing it at a wafer level and a method for repairing it at a package level. A defective memory cell may be replaced with a redundancy memory cell in the wafer level after a test operation is performed on a wafer. In addition, after the test operation is performed in the package level of a semiconductor device, a defective memory cell may be replaced with a redundancy memory cell which is designed to replace the defective memory cell in the package level. This method is referred to as a post-package repair operation.

The post-package repair operation is performed as a command for performing a repair operation and is applied to a memory from a memory controller. A predetermined address and command are applied to the memory from the memory controller to set a post-package repair (PPR) mode for performing the post-package repair operation. The memory may perform the post-package repair operation based on the received predetermined address and command.

SUMMARY

Exemplary embodiments of the present invention are directed to a semiconductor device that may prevent malfunction of a repair operation by controlling an entry to a post-package repair (PPR) mode, and a semiconductor system including the semiconductor device.

In accordance with an embodiment of the present invention, a semiconductor system includes: a memory controller, and a memory suitable for determining whether to enable a control signal in response to block mode entry signals applied from the memory controller, entering a repair mode in response to a first address and a first command applied from the memory controller, and blocking an entry to the repair mode during an enabling section of the control signal regardless of the first address and the first command.

In accordance with another embodiment of the present invention, a method for operating a semiconductor system including a memory controller and a memory includes: determining a block mode of the memory in response to block mode entry signals applied from the memory controller, controlling the memory to enter a repair mode in response to a first address and a first command generated from the memory controller, and blocking the memory entering the repair mode in the block mode, regardless of the first address and the first command.

In accordance with another embodiment of the present invention, a semiconductor device includes a control signal generation block suitable for generating a control signal in response to block mode entry signals applied from an exterior, and a mode enabling signal generation block suitable for enabling a mode enabling signal for determining whether or not to enter a repair mode in response to a first address and a first command applied from the exterior during a disabling section of the control signal and disabling the mode enabling signal regardless of the first address and the first command during an enabling section of the control signal.

DETAILED DESCRIPTION

Exemplary embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete, and fully convey the scope of the present invention to those skilled in the art. Throughout the disclosure, like reference numerals refer to like parts throughout the various figures and embodiments of the present invention.

In the drawings thicknesses and lengths of components are exaggerated compared to actual physical thickness and length for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component of indirectly coupled through another component. In this specification a singular form may include a plural form as long as it is not specifically mentioned. Furthermore, 'include/comprise' or 'including/comprising' used in the specification represents that one of more components, steps, operations, and elements exits or are added.

First Embodiment

Figure 1:
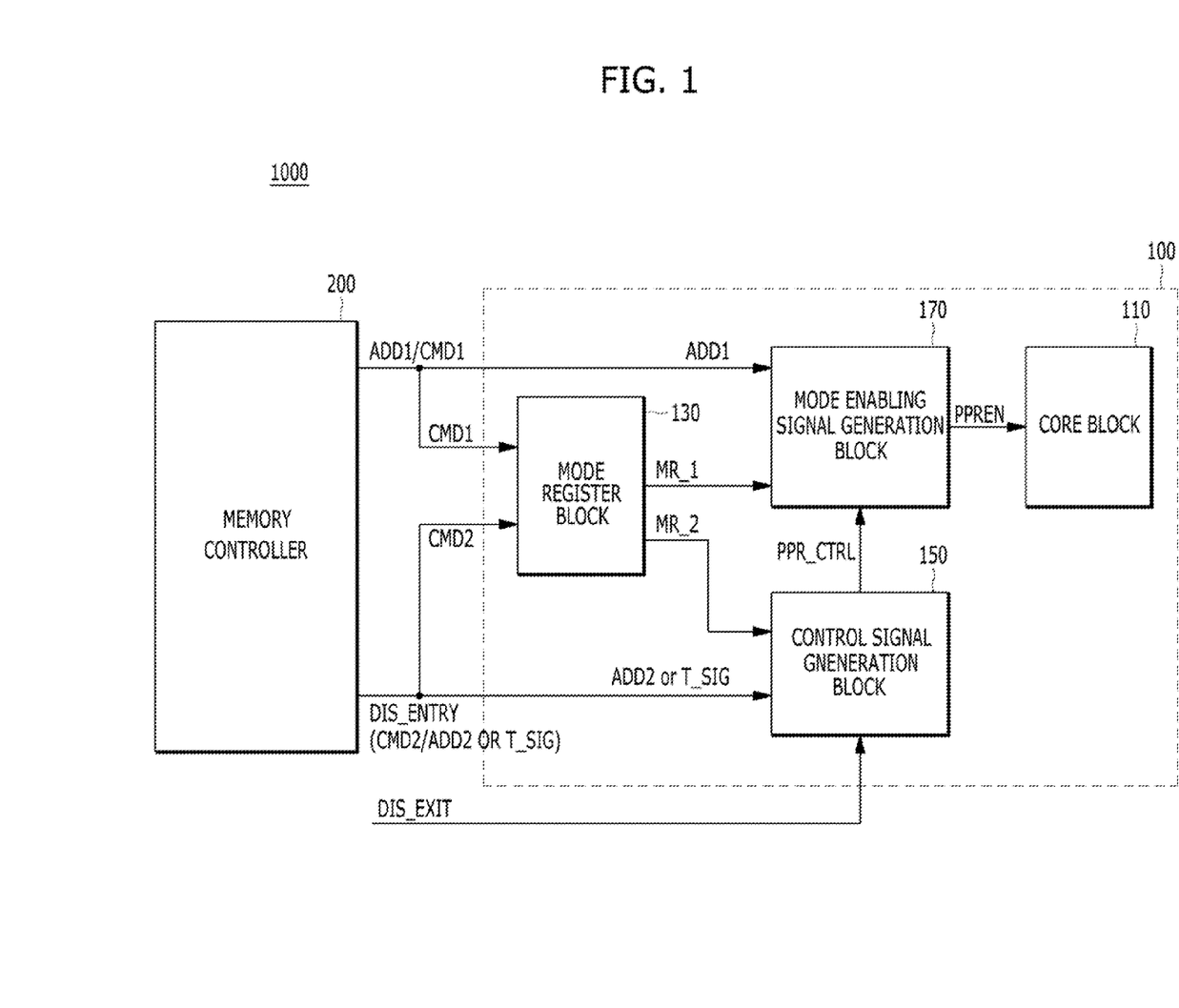
FIG. 1 is a block diagram illustrating a semiconductor system in accordance with a first embodiment of the present invention.

FIG. 1 is a block diagram illustrating a semiconductor system 1000 in accordance with a first embodiment of the present invention.

Referring to FIG. 1, the semiconductor system 1000 may include a memory 100 and a memory controller 200. The memory 100 may include a core block 110, a mode register block 130, a control signal generation block 150, and a mode enabling signal generation block 170.

The memory controller 200 may generate and transmit a first address ADD1, a first command CMD1 and a block mode entry signal DIS_ENTRY for controlling the memory 100 to the memory 100. The block mode entry signal DIS_ENTRY may be a second address ADD2 and a second command CMD2 which are transmitted from the memory controller 200 to the memory 100. Also, the block mode entry signal DIS_ENTRY may include not only the second address ADD2 and the second command CMD2, which are applied from the memory controller 200 but also a test operation signal for defining a test section of the memory 100. The test operation signal may be generated in response to a test signal T_SIG and the second command CMD2 which are directly applied from the memory controller 200. The first address ADD1 and the first command CMD1 may be signals for determining whether the memory 100 enters a repair mode. The repair mode may be a mode to perform a post-package repair (PPR) operation that indicates a repair operation which is performed on a memory of a package level.

The memory 100 may determine whether a control signal PPR_CTRL is enabled in response to the block mode entry signal DIS_ENTRY which is applied from the memory controller 200. Although the memory 100 may enter the repair mode in response to the first address ADD1 and the first command CMD1 which are applied from the memory controller 200, an entry to the repair mode of the memory 100 is forcibly blocked during an enabling section of the control signal PPR_CTRL.

The core block 110 of the memory 100 may include a plurality of cells (not shown) and operate as a PPR mode when information for setting to the repair mode is applied from the memory controller 200. The PPR mode may be a mode to perform the repair operation, which indicates an operation to repair a defective cell with a redundancy cell corresponding to the defective cell when a defective cell is found among the cells. The memory 100 may receive the information for entering the repair mode based on the first address ADD1 and the first command CMD1 applied from the memory controller 200. In other words, the core block 110 may perform the repair operation based on a command of entering the repair mode, which is applied from the memory controller 200.

The mode register block 130 may generate various mode register set (MRS) codes based on the first command CMD1 which is applied from the memory controller 200. In general, the memory 100 may preset an operation mode and operate. In other words, the memory controller 200 may preset a column address strobe latency, a burst type, a burst length, etc. in the memory 100 before accessing the memory 100. The place for setting and storing the operation mode may be the mode register block 130.

The first command CMD1 which is applied to the mode register block 130 may be decoded in a command decoder (not shown) of the memory 100. The mode register block 130 sets a first MRS code MR_1 in response to the first command CMD1. The first MRS code MR_1 set from the mode register block 130 relates to the repair operation of the core block 110. In other words, the first MRS code MR_1 is for entering the PPR mode of the core block 110 based on the first command CMD1.

The control signal generation block 150 may enable the control signal PPR_CTRL in response to the block mode entry signal DIS_ENTRY applied from the memory controller 200. Also, the control signal generation block 150 may disable the control signal PPR_CTRL in response to a block mode exit signal DIS_EXIT which is applied from the memory controller 200 or generated from within the memory 100. Therefore, the control signal generation block 150 may set the control signal PPR_CTRL based on the block mode entry, signal DIS_ENTRY and initializes the control signal PPR_CTRL based on the block mode exit signal DIS_EXIT.

The mode enabling signal generation block 170 may generate a mode enabling signal PPREN for determining whether to enter the repair mode based on the control signal PPR_CTRL, the first address ADD1 and the first command CMD1. To be specific, the mode enabling signal generation block 170 may enable the mode enabling signal PPREN in response to the first address ADD1 and the first MRS code MR_1, which is set based on the first command CMD1, during a disabling section of the control signal PPR_CTRL. In other words, during the disabling section of the control signal PPR_CTRL, when the first address ADD1 and the first MRS code MR_1 are applied, the mode enabling signal PPREN is enabled, and then the mode enabling signal generation block 170 enters the PPR mode, and when the first address ADD1 and the first MRS code MR_1 are not applied, the mode enabling signal PPREN is disabled, and then the mode enabling signal generation block 170 does not enter the PPR mode. On the other hand the mode enabling signal generation block 170 disables the mode enabling signal PPREN during an enabling section of the control signal PPR_CTRL, regardless of the first address ADD1 and the first MRS code MR_1.

The block mode entry signal DIS_ENTRY is applied to the memory 100 from the memory controller 200 in order to block the entry to the repair mode. When the control signal PPR_CTRL is enabled in response to the block mode entry signal DIS_ENTRY in the memory 100, the mode enabling signal PPREN is disabled, and then the entry to the repair mode PPR is forcibly blocked although the first address ADD1 and the first command CMD1 are applied. Subsequently, when the block mode exit signal DIS_EXIT is applied to the memory 100 from the memory controller 200 in order to enter the repair mode, the control signal PPR_CTRL is disabled in response to the block mode exit signal DIS_EXIT in the memory 100. When the control signal PPR_CTRL is disabled, and the first address ADD1 and the first command CMD1 are applied, the mode enabling signal PPREN is enabled, and the core block 110 enters the repair mode.

The semiconductor system 1000 in accordance with the first embodiment of the present invention determines a block mode entry/exit of the memory 100 in response to the block mode entry signal DIS_ENTRY applied from the memory controller 200. The block mode may mean a mode for blocking the repair mode of the memory 100. The memory 100 may enter the repair mode in response to the first address ADD1 and the first command CMD1 which are generated from the memory controller 200 during the block mode exit. On the other hand, the repair mode entry of the memory 100 is forcibly blocked during the block mode entry. Therefore, the semiconductor system 1000 may prevent malfunction of a repair operation by blocking an unintentional entry to the repair mode that nay occur inside the memory 100.

Figure 2:
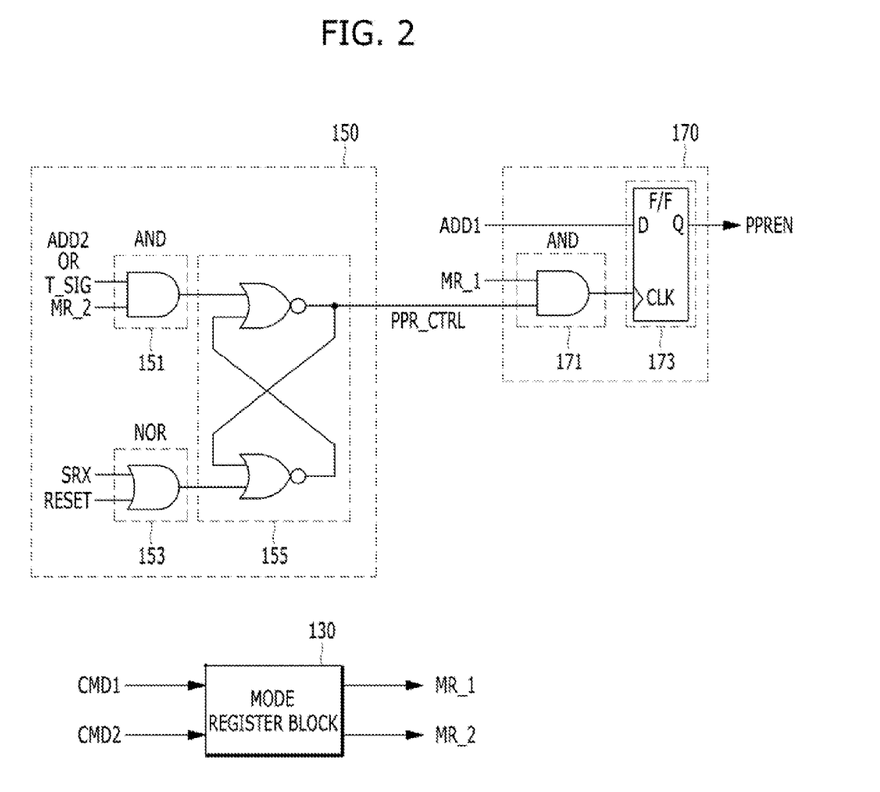
FIG. 2 is a circuit diagram exemplarily illustrating a memory shown in FIG. 1.

FIG. 2 is a circuit diagram exemplarily illustrating the memory 100 shown in FIG. 1.

Referring to FIG. 2, the memory 100 may include the mode register block 130, the control signal generation block 150 and the mode enabling signal generation block 170. The control signal generation block 150 may include a control signal set unit 151, a control signal initialization unit 153 and a latch unit 155. The mode enabling signal generation block 170 may be formed of a mode enabling signal control unit 171 and an output unit 173.

The mode register block 130 may output the first MRS code MR_1 which is set based on the first command CMD1 applied from the memory controller 200. Also, the mode register block 130 may output a second MRS code MR_2 which is set based on the second command CMD2 applied from the memory controller 200. The first address ADD1 and the first command CMD1 may be signals for determining whether the memory 100 enters the repair mode. Therefore, the first MRS code MR_1 may be a code for entering the repair mode. As described above, the block mode entry signal DIS_ENTRY for blocking the repair mode entry may be the second address ADD2. The second address ADD2 may be combined with the second MRS code MR_2 which is set based on the second command CMD2. Also, the block mode entry signal DIS_ENTRY may be a test operation signal for defining a test section of the memory 100. To be specific, the test operation signal may be generated in response to the test signal T_SIG and combined with the second MRS code MR_2.

Hereinafter, the second command CMD2 and the second address ADD2 are described as the block mode entry signal DIS_ENTRY.

The control signal set unit 151 may be formed of an AND gate AND. The control signal set unit 151 may receive the second address ADD2 and the second MRS code MR_2. The control signal set unit 151 may enable a first output signal A to a logic high level during a section where the second address ADD2 and the second MRS code MR_2 are enabled to a logic high level. Therefore, in order to block the repair mode, the control signal set unit 151 sets the first output signal A to enable the control signal PPR_CTRL, based on the second address ADD2 and the second MRS code MR_2. Although a case where the control signal PPR_CTRL is generated based on the second address ADD2 and the second MRS code MR_2 which are inputted to the control signal set unit 151 is described as an example, the control signal PPR_CTRL may be set based on a combination of the second MRS code MR_2 and the test signal T_SIG which is applied from the memory controller 200.

The control signal initialization unit 153 may be formed of a NOR gate NOR. The control signal initialization unit 153 may enable a second output signal B to a logic high level when a first block mode exit signal RESET or a second block mode exit signal SRX which are applied are enabled to a logic high level. The first block mode exit signal RESET may be a signal applied from the memory controller 200, and the second block mode exit signal SRX may be a signal set inside the memory 100. In other words, the second block mode exit signal SRX may be set based on a predetermined command inside the memory 100 or generated based on a combination of signals which control the memory 100. Therefore, when the repair mode of the memory 100 is performed, the control signal initialization unit 153 may disable the control signal PPR_CTRL based on the first block mode exit signal RESET which is applied from the memory controller 200, and it may also disable the control signal PPR_CTRL based on the second block mode exit signal SRX which is set inside the memory 100.

The latch unit 155 outputs the control signal PPR_CTRL to a logic high level when the first output signal A is enabled to a logic high level, and it outputs the control signal PPR_CTRL to a logic low level when the second output signal B is enabled to a logic high level.

The mode enabling signal control unit 171 of the mode enabling signal generation block 170 may be formed of an AND gate AND. The first MRS code MR_1 and the control signal PPR_CTRL which are inputted to the mode enabling signal control unit 171 are combined and transmitted to the output unit 173. The output unit 173 may be formed of a flip-flop F/F. The first address ADD1 is inputted to an input terminal D of the flip-flop F/F. A signal which is outputted from the mode enabling signal control unit 171 is applied to a clock terminal CLK of the flip-flop F/F. An output terminal Q of the flip-flop F/F outputs the first address ADD1 in synchronization with the first MRS code MR_1 and the control signal PPR_CTRL as the mode enabling signal PPREN.

Although not illustrated in the drawing, the mode enabling signal generation block 170 may include a mode enabling signal initialization unit for initializing the mode enabling signal PPREN in response to an initialization signal (not shown) which is applied from the memory controller 200 or generated from an interior of the memory 100.

Operations of the control signal generation block 150 and the mode enabling signal generation block 170 are described below in detail. For example, the control signal PPR_CTRL is enabled when the second address ADD2 and the second MRS code MR_2 are applied to the control signal set unit 151 of the control signal generation block 150. When the control signal PPR_CTRL is enabled, the mode enabling signal PPREN is disabled regardless of whether or not the first address ADD1 and the first MRS code MR_1 are inputted. On the other hand, the control signal PPR_CTRL is disabled when the first block mode exit signal RESET or the second block mode exit signal SRX is applied. In this case, whether the mode enabling signal generation block 170 generates the mode enabling signal PPREN is determined based on the first address ADD1 and the first MRS code MR_1. In other words, the control signal PPR_CTRL is disabled when the first block mode exit signal RESET or the second block mode exit signal SRX is applied in order to enter the repair mode PPR. The first MRS code MR_1 is outputted from the mode register block 130 which receives the first command CMD1, and the mode enabling signal PPREN is enabled based on the first MRS code MR_1 and the first address ADD1.

Second Embodiment

Figure 3:
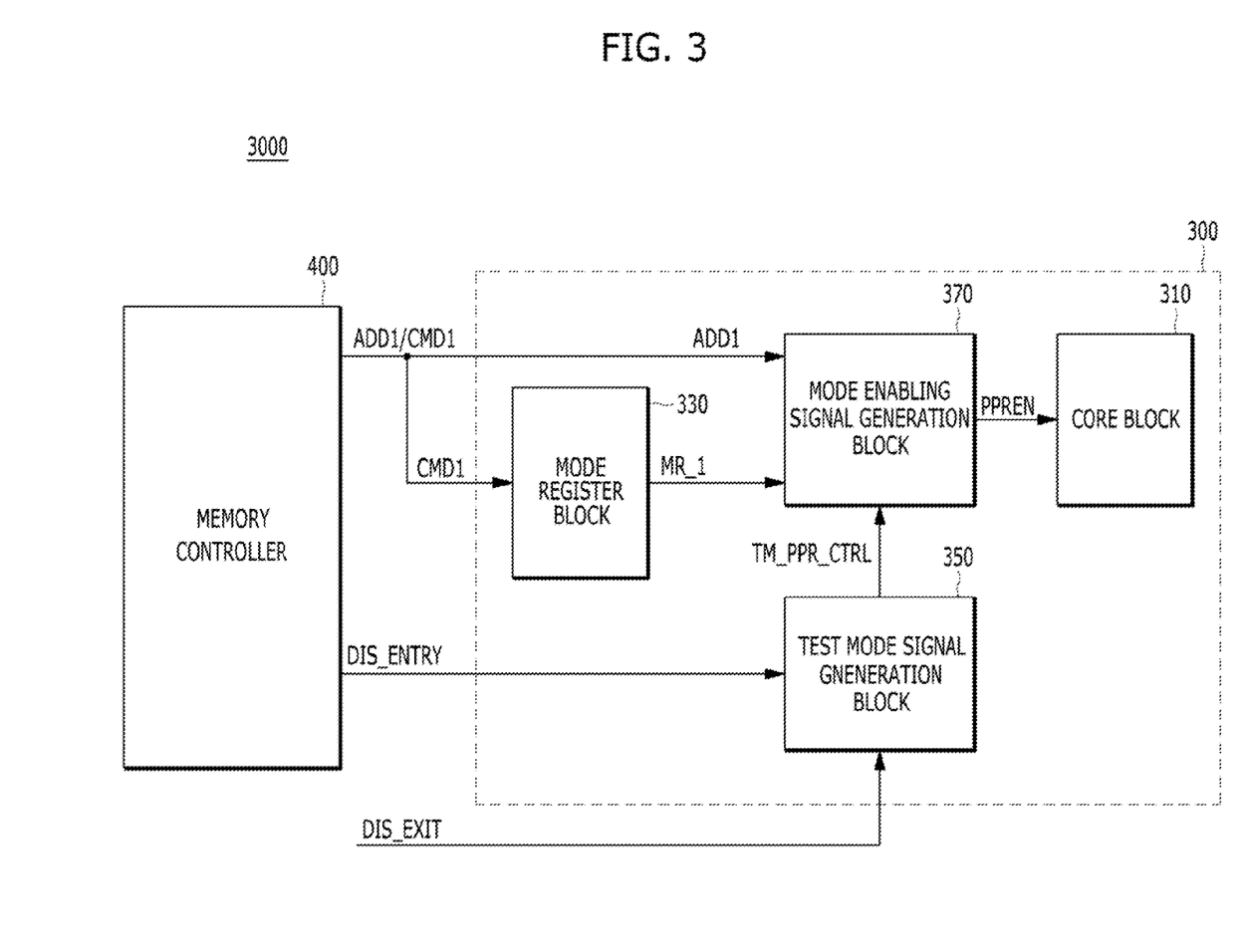
FIG. 3 is a block diagram illustrating a semiconductor system in accordance with a second embodiment of the present invention.

FIG. 3 is a block diagram illustrating a semiconductor system 3000 in accordance with a second embodiment of the present invention.

Referring to FIG. 3, the semiconductor system 3000 may include a memory 300 and a memory controller 400. The memory 300 may include a core block 310, a mode register block 330, a test mode signal generation block 350, and a mode enabling signal generation block 370.

The memory controller 400 may generate and transmits a first address ADD1, a first command CMD1 and a block mode entry signal DIS_ENTRY for controlling the memory 300 to the memory 300. The block mode entry signal DIS_ENTRY may be a second address ADD2 and a test control signal CTRL_SIG which are applied from the memory controller 400. The first address ADD1 and the first command CMD1 may be signals for determining whether or not the memory 300 enters a repair mode. The repair mode may be a mode to perform a post-package repair (PPR) operation that indicates a repair operation which is performed on a memory of a package level.

The memory 300 may determine whether a test mode signal TM_PPR_CTRL is enabled in response to the block mode entry signal DIS_ENTRY which is applied from the memory controller 400. Although the memory 300 may enter the repair mode in response to the first address ADD1 and the first command CMD1 which are applied from the memory controller 400, an entry to the repair mode of the memory 300 is forcibly blocked during an enabling section of the test mode signal TM_PPR_CTRL.

The core block 310 of the memory 300 may include (not shown), and operate as a PPR mode when information for setting to the repair mode is applied from the memory controller 400. The PPR mode may be a mode to perform the repair operation which indicates an operation to repair a defective cell with a redundancy cell corresponding to the defective cell when the defective cell is found among the cells. The memory 300 may receive the information for entering the repair mode based on the first address ADD1 and the first command CMD1 applied from the memory controller 400. In other words, the core block 310 may perform the repair operation based on a command of entering the repair mode, which is applied from the memory controller 400.

The mode register block 330 may generate various mode register set (MRS) codes based on the first command CMD1 which is applied from the memory controller 400. In general, the memory 300 may preset the operation mode. The first command CMD1 which is applied to the mode register block 330 may be decoded in a command decoder (not shown) of the memory 300. The mode register block 330 sets a first MRS code MR_1 in response to the first command CMD1. The first MRS code MR_1 set from the mode register block 330 may be a code relating to the repair operation of the core block 310. In other words, the first MRS code MR_1 may mean a code for entering the PPR mode of the core block 310 based on the first command CMD1.

The test mode signal generation block 350 may enable the test mode signal TM_PPR_CTRL in response to the block mode entry signal DIS_ENTRY applied from the memory controller 400. Also, the test mode signal generation block 350 may disable the test mode signal TM_PPR_CTRL in response to a block mode exit signal DIS_EXIT which is applied from the memory controller 400 or generated from an interior of the memory 300. Therefore, the test mode signal generation block 350 may set the test mode signal TM_PPR_CTRL based on the block mode entry signal DIS_ENTRY and initializes the test mode signal TM_PPR_CTRL based on the block mode exit signal DIS_EXIT.

The mode enabling signal generation block 370 may generate a mode enabling signal PPREN for determining whether or not to enter the repair mode based on the test mode signal TM_PPR_CTRL, the first address ADD1 and the first command CMD1. To be specific, the mode enabling signal generation block 370 may enable the mode enabling signal PPREN in response to the first address ADD1 and the first MRS code MR_1, which is set based on the first command CMD1, during a disabling section of the test mode signal TM_PPR_CTRL. In other words, during the disabling section of the test mode signal TM_PPR_CTRL, when the first address ADD1 and the first MRS code MR_1 are applied, the mode enabling signal PPREN is enabled, and then the mode enabling signal generation block 370 enters the PPR mode, and when the first address ADD1 and the first MRS code MR_1 are not applied, the mode enabling signal PPREN is disabled, and then the mode enabling signal generation block 370 does not enter the PPR mode. On the other hand, the mode enabling signal generation block 370 disables the mode enabling signal PPREN during an enabling section of the test mode signal TM_PPR_CTRL regardless of the first address ADD1 and the first MRS code MR_1.

The block mode entry signal DIS_ENTRY is applied to the memory 300 from the memory controller 400 in order to block the entry to the repair mode. When the test mode signal TM_PPR_CTRL is enabled in response to the block mode entry signal DIS_ENTRY in the memory 300, the mode enabling signal PPREN is disabled, and then the entry to the repair mode PPR is forcibly blocked although the first address ADD1 and the first command CMD1 are applied. Subsequently, when the block mode exit signal DIS_EXIT is applied to the memory 300 from the memory controller 400 in order to enter the repair mode, the test mode signal TM_PPR_CTRL is disabled in response to the block mode exit signal DIS_EXIT in the memory 300. When the test mode signal TM_PPR_CTRL is disabled and the first address ADD1 and the first command CM1 are applied, the mode enabling signal PPREN is enabled, and the core block 310 enters the repair mode.

The semiconductor system 3000 in accordance with the second embodiment of the present invention may set the test made signal TM_PPR_CTRL inside the memory 300 based on the block mode entry signal DIS_ ENTRY applied from the memory controller 400. In other words, the semiconductor system 3000 may set a predetermined test mode based on the test mode signal TM_PPR_CTRL and control an entry to the repair mode. As a result, the semiconductor system 3000 may block an unintentional entry to the repair mode that may occur during an internal test operation.

Figure 4:
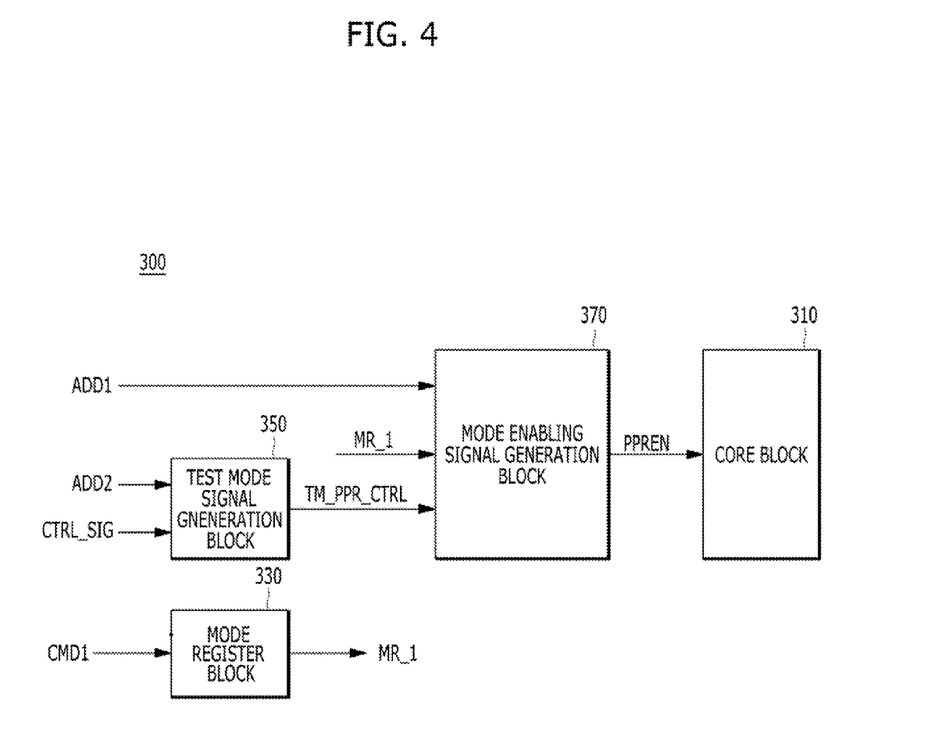
FIG. 4 is a block diagram exemplarily illustrating a memory shown in FIG. 3.

FIG. 4 is a block diagram exemplarily illustrating the memory 300 shown in FIG. 3.

Referring to FIG. 4, the memory 300 may include the core block 310, the mode register block 330, the test mode signal generation block 350, and the mode enabling signal generation block 370.

As described above, the core block 310 may perform the PPR operation based on a command of entering the repair mode from the memory controller 400. The mode register block 330 may generate the first MRS code MR_1 based on the first command CMD1 which is applied from the memory controller 400.

The test mode signal generation block 350 may generate the test mode signal TM_PPR_CTRL based on the second address ADD2 and the test control signal CTRL_SIG which are inputted. An address signal ADD<7> among the second address ADD2 may be a signal where information for controlling a test mode entry/exit is inputted thereto. The other-bit address signal is used to select a mode to be tested at present among various test modes. Also, the test control signal CTRL_SIG may be used together with the address signal ADD<7> when a predetermined test mode is enabled or disabled. The mode enabling signal PPREN is forcibly disabled based on the test mode signal TM_PPR_CTRL. In other words, the test mode signal TM_PPR_CTRL may be a signal for blocking an entry to the repair mode of the memory 300 by disabling the mode enabling signal PPREN.

The mode enabling signal generation block 370 may generate the mode enabling signal PPREN based on the first address ADD1 the first MRS code MR_1 and the test mode signal TM_PPR_CTRL_ which are applied thereto. The mode enabling signal generation block 370 may enable the mode enabling signal PPREN in response to the first address ADD1 and the first MRS code MR_1 during a disabling section of the test mode signal TM_PPR_CTRL. During an enabling section of the test mode signal TM_PPR_CTRL, the mode enabling signal generation block 370 disables the mode enabling signal PPREN, regardless of the first address ADD1 and the first MRS code MR_1. For example, when the memory 300 is not at the test mode, the test mode signal TM_PPR_CTRL is disabled. When the first address ADD1 and the first MRS code MR_1 are applied from an exterior in order to enter the PPR mode, the mode enabling signal PPREN is enabled, and the core block 310 enters the PPR mode.

The effect on the semiconductor system in accordance with the embodiments of the present invention is described below with reference to timing diagrams.

Figure 5A:
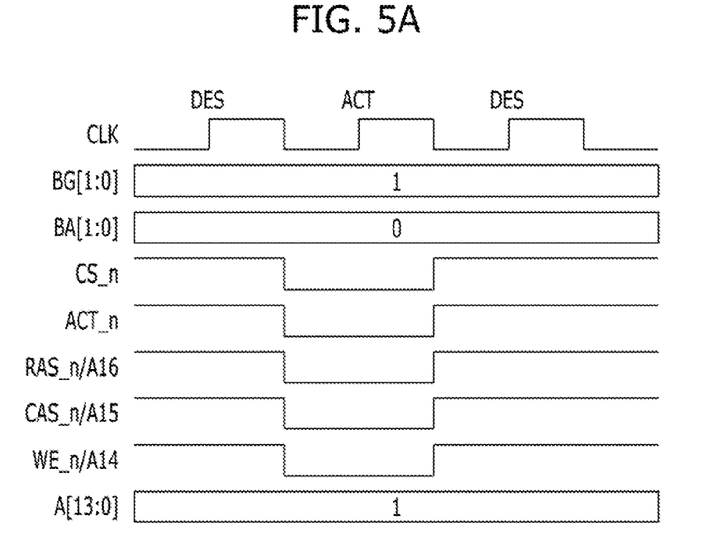
FIG. 5A is a timing diagram showing an operation of a memory when a command is inputted thereto.
Figure 5B:
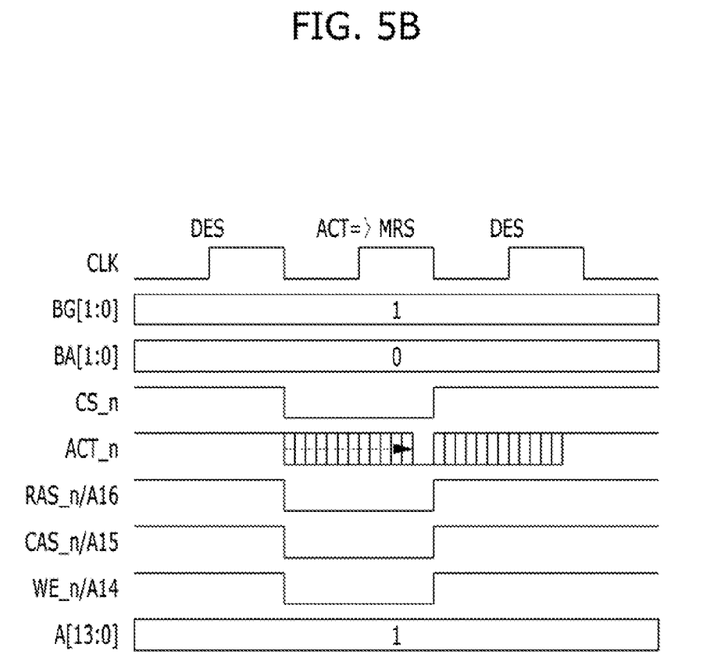
FIG. 5B is a timing diagram describing a problem that may occur inside the memory.

FIG. 5A is a timing diagram showing an operation of a memory when a command is inputted thereto. FIG. 5B is a timing diagram describing a problem that may occur inside the memory.

In general, an address and a command are applied through a plurality of pins or pads included in a memory. Referring to FIG. 5A, a timing diagram for performing an active operation may be shown based on a plurality of address signals BG[1:0] BA[1:0] and A[13:0] applied to a plurality of address pins and a plurality of command signals CS_n, ACT_n, RAS_n/A16, CAS_n/A15 and WE_n/A14 applied to a plurality of command pins.

FIG. 5B shows a problem that may occur during a training operation inside the memory. The training operation is an operation required for properly operating the memory at high operation speed, In other words, an interface training operation between the memory and a data process device has to be performed during an initial operation of the memory. Before a normal operation between the memory and the data process device is performed through the interface training operation, an operation for transmitting a command, an address and data is optimized. Referring to FIG. 5B, when the training operation is performed on an active command pin during the initial operation of the memory, an operation of searching for an optimized moment within a proper input setup time/input hold time (tIS/tIH) parameter of an internal clock signal CLK is performed by time-sweeping the active command signal ACT_n applied to the active command pin during the training operation. When the active command signal ACT_n deviates from the tIS/tIH parameter of the clock signal CLK, an operation of setting an MRS code may be performed based on a combination of signals applied to the other pins. The memory may malfunction by entering the repair mode internally through a combination of the set MRS code and address, not through a command of entering a repair mode from a memory controller. Therefore, when the active command signal and a write command signal are inputted thereafter, the memory enters the repair mode and an operation of repairing the memory is performed. This may cause a problem in that a PPR redundancy cell to be used later is used in advance.

However, the semiconductor system in accordance with the embodiments of the present invention may block entry to the repair mode in response to a block mode entry signal during a block mode entry for blocking the repair mode. Thus, in order to prevent the semiconductor system from entering the repair mode as a result of recognizing that the MRS code is set as the training operation as shown in FIG. 5B, such block mode entry signals as addresses and commands are set so that the repair mode may be controlled to be blocked. Also, the entry to the repair mode may be blocked in the process of checking a margin of the tIS/tIH or a margin of a reference voltage during an internal test of the memory. This may have the effect of preventing the repair operation from being set by internal malfunctions of the memory.

In accordance with the embodiments of the present invention, the semiconductor system may prevent malfunction of a repair operation by blocking an unintentional entry to a repair mode that may occur inside a memory.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

Also, dispositions and types of logic gates and transistors described in the aforementioned embodiments may be implemented differently based on the polarities of the inputted signals.

What is claimed is:

1. A semiconductor system, comprising:
    a memory controller; and
    a memory suitable for determining whether to enable a control signal in response to block mode entry signals applied from the memory controller, entering a repair mode in response to a first address and a first command applied from the memory controller, and blocking an entry to the repair mode during an enabling section of the control signal, regardless of the first address and first command.

2. The semiconductor system of claim wherein the repair mode is a post-package repair mode.

3. The semiconductor system of claim 1, wherein the block mode entry signals are a second address and a second command applied from the memory controller.

4. The semiconductor system of claim 3, wherein the memory includes:
    a control signal generation block suitable for generating the control signal in response to the second address and the second command; and
    a mode enabling signal generation block suitable for generating a mode enabling signal for determining whether to enter the repair mode based on the first address, the first command and the control signal.

5. The semiconductor system of claim 1, wherein the block mode entry signals are test operation signals for defining a test section of the memory.

6. The semiconductor system of claim 4, wherein the mode enabling signal generation block includes:
    a mode enabling signal control unit suitable for enabling the mode enabling signal in response to the first address and the first command during a disabling section of the control signal and disabling the mode enabling signal regardless of the first address and the first command during the enabling section of the control signal; and
    a mode enabling signal initialization unit suitable for initializing the mode enabling signal in response to an initialization signal which is applied from the memory controller or generated from the interior of the memory.

7. The semiconductor system of claim 4, wherein the mode enabling signal is disabled and the memory blocks the entry to the repair mode, regardless of the first address and the first command, when the control signal is enabled, and the mode enabling signal is enabled and the memory enters the repair mode, in response to the first address and the first command, when the control signal is disabled.

8. The semiconductor system of claim 4, wherein the control signal generation block includes:
 a control signal set unit suitable for enabling the control signal in response to the second address and the second command; and
 a control signal initialization unit suitable for disabling the control signal in response to a block mode exit signal which is applied from the memory controller or generated from an interior of the memory.

9. The semiconductor system of claim 1, wherein the memory is in a package level.

10. A method for operating a semiconductor system including a memory controller and a memory, comprising:
 determining a block mode of the memory in response to block mode entry signals applied from the memory controller;
 controlling the memory to enter a repair mode in response to a first address and a first command generated from the memory controller; and
 blocking the memory entering the repair mode in the block mode, regardless of the first address and the first command.

11. The method of claim 10, wherein the repair mode is a post-package repair mode.

12. The method of claim 10, wherein the block mode entry signals are a second address and a second command generated from the memory controller.

13. The method of claim 12, wherein the determining of the block mode of the memory includes:
 entering the block mode in response to the second address and the second command; and
 exiting from the block mode in response to a block mode exit signal which is applied from the memory controller or generated from an interior of the memory.

14. The method of claim 10, wherein the block mode entry signals are test operation signals for defining a test section of the memory.

15. A semiconductor device, comprising:
 a control signal generation block suitable for generating a control signal in response to block mode entry signals applied from an exterior; and
 a mode enabling signal generation block suitable for enabling a mode enabling signal for determining whether to enter a repair mode in response to a first address and a first command applied from the exterior during a disabling section of the control signal and disabling the mode enabling signal regardless of the first address and the first command during an enabling section of the control signal.

16. The semiconductor device of claim 15, wherein the repair mode is a post-package repair mode.

17. The semiconductor device of claim 15, wherein the block mode entry signals are a second address and a second command applied from the exterior.

18. The semiconductor device of claim 17, wherein the control signal generation block includes:
 a control signal set unit suitable for enabling the control signal in response to the second address and the second command; and
 a control signal initialization unit suitable for disabling the control signal in response to a block mode exit signal which is applied from the exterior or generated from an interior of the memory.

19. The semiconductor device of claim 15, wherein the block mode entry signals are test operation signals for defining a test section of the memory.

20. The semiconductor device of claim 15, wherein the mode enabling signal generation block includes:
 a mode enabling signal control unit suitable for enabling the mode enabling signal in response to the first address and the first command during the disabling section of the control signal and disabling the mode enabling signal regardless of the first address and the first command during the enabling section of the control signal; and
 a mode enabling signal initialization unit suitable for initializing the mode enabling signal in response to an initialization signal which is applied from the exterior or generated from the interior of the memory.

* * * * *